United States Patent [19]
Xu et al.

[11] Patent Number: 5,946,129
[45] Date of Patent: Aug. 31, 1999

[54] WAVELENGTH CONVERSION APPARATUS WITH IMPROVED EFFICIENCY, EASY ADJUSTABILITY, AND POLARIZATION INSENSITIVITY

[75] Inventors: Chang-Qing Xu; Hideaki Okayama; Keisuke Shinozaki, all of Tokyo, Japan

[73] Assignee: Oki Electric Industry Co., Ltd., Tokyo, Japan

[21] Appl. No.: 08/920,884

[22] Filed: Aug. 29, 1997

[30] Foreign Application Priority Data

Sep. 5, 1996 [JP] Japan .................................. 8-235065
Jan. 30, 1997 [JP] Japan .................................. 9-016632

[51] Int. Cl.$^6$ .................................................. G02F 1/39
[52] U.S. Cl. .................................... 359/332; 385/122
[58] Field of Search .................................... 359/326–332; 385/122; 372/21, 22

[56] References Cited

U.S. PATENT DOCUMENTS

| | | | |
|---|---|---|---|
| 3,697,888 | 10/1972 | Danielmeyer | 359/328 X |
| 4,784,450 | 11/1988 | Jain et al. | 359/332 |
| 4,807,953 | 2/1989 | Smith et al. | 359/326 X |
| 5,072,135 | 12/1991 | Huignard et al. | 359/327 |
| 5,079,445 | 1/1992 | Guyer | 359/330 |
| 5,386,314 | 1/1995 | Jopson | 359/326 |
| 5,412,502 | 5/1995 | Makio et al. | 359/332 |

FOREIGN PATENT DOCUMENTS

| | | |
|---|---|---|
| 0 486 192 | 5/1992 | European Pat. Off. . |
| 09033962 | 2/1997 | Japan . |

OTHER PUBLICATIONS

R. Regener et al., "Efficient second–harmonic generation in Ti:LiNbO$_3$ channel waveguide resonators," Journal of Optical Society of America B, vol. 5, No. 2, pp. 267–277 (Feb. 1988).

K. Shinozaki et al., "Conversion Efficiency Enhancement Technique for a Quasiphase Matched Second–Harmonic Generation Device," Japan Journal of Applied Physics, vol. 31, pp. 2104–2108 ((1992). (Jul. 1992).

C. Q. Xu et al., "Wavelength conversions~1.5 $\mu$m by difference frequency generation in periodically domain–inverted LiNbO$_3$ channel waveguides," Applied Physics Letters, vol. 63 (9), pp. 1170–1172 (Aug. 30, 1993).

H. Okayama et al., "Novel Scheme to Achieve Polarization . . . Dependent Optical Wavelength Filter," MOC/GRIN '93, Kawasaki, pp. 18–21 (1993).

S. Y. Yi et al., "Second–harmonic generation in a LiTaO$_3$ waveguide domain–inverted by proton exchange and masked heat treatment," Applied Physics Letter 68 (18), pp. 2493–2495 (Apr. 29, 1996).

S. J. B. Yoo et al., "Wavelength conversion by difference frequency generation in AlGaAs waveguides with periodic domain inversion achieved by wafer bonding," Applied Physics Letters 68 (19), pp. 2609–2611 (May 6, 1996).

Henri Porte et al., "Electrooptic Tuning of a Fiber Ring Semiconductor Laser". *IEEE Photonics Technology Letters*, vol. 7, No. 7, Jul. 1995, pp. 700–702.

*Primary Examiner*—John D. Lee
*Attorney, Agent, or Firm*—Rabin & Champagne, P.C.

[57] ABSTRACT

A wavelength conversion apparatus has an optical amplifier, a wavelength converter, and an optical coupler coupled to form an optical ring resonator. The optical amplifier supplies pump light. The wavelength converter generates converted light, either from the pump light alone or by interaction between the pump light and signal light supplied from a signal source. The optical coupler extracts the converted light. The optical ring resonator preferably includes a tunable optical bandpass filter that defines the wavelength of the pump light. The optical coupler may also couple the signal light into the optical ring resonator, preferably through a polarization beam splitter and at least one polarization rotator, making the apparatus insensitive to the polarization of the signal light.

42 Claims, 10 Drawing Sheets

WAVELENGTH CONVERSION APPARATUS WITH IMPROVED EFFICIENCY, EASY ADJUSTABILITY, AND POLARIZATION INSENSITIVITY

BACKGROUND OF THE INVENTION

The present invention relates to a wavelength conversion apparatus, and more particularly to a wavelength conversion apparatus with improved conversion efficiency, which can be easily adjusted to maximize the conversion efficiency, and which is insensitive to the polarization of signal light.

The conversion of light from one wavelength to another is necessary for purposes such as wavelength-division multiplexing in fiber-optic communications. Known wavelength conversion devices include bulk-element devices comprising non-linear optical crystals, integrated waveguide devices with a domain inversion grating formed in a semiconductor material, and integrated waveguide devices formed in non-linear optical materials, with or without a domain inversion grating. The methods of wavelength conversion employed in these devices include second-harmonic generation (SHG), sum-frequency generation (SFG), and difference-frequency generation (DFG).

A common problem in all of these devices is inadequate conversion efficiency. Efficiency is particularly low in bulk-element devices, because of dispersion.

In semiconductor waveguide devices with a domain inversion structure, the problem of low conversion efficiency is compounded by a complex and difficult fabrication process, including steps such as wafer bonding and crystal regrowth.

Waveguides formed in non-linear optical materials such as lithium niobate ($LiNbO_3$), lithium tantalate ($LiTaO_3$), and potassium titanyl phosphate ($KTiOPO_4$, commonly abbreviated KTP) appear to offer the best hope for high conversion efficiency in a device of simple structure. The simplest structure directs pump light with a fundamental wavelength from a laser into a waveguide formed in a non-linear optical material. Non-linear optical effects convert part of the fundamental wave to a second harmonic wave having half the wavelength of the fundamental wave, but the conversion efficiency is inadequate when a low-power semiconductor laser diode is employed as the fundamental light source.

The conversion efficiency can be enhanced by placing wavelength-selective reflecting structures, such as multi-layer reflective coatings or distributed Bragg reflector gratings, at each end of the waveguide, to confine the fundamental wave while transmitting the second harmonic wave. Such reflecting structures also reduce the amount of fundamental power coupled into the waveguide, however. Finding the reflectivities that optimize the conversion efficiency is a difficult design problem.

A further problem is that a stringent phase-matching or quasi-phase-matching condition is placed on the wavelength of the pump light. Since the laser that produces the pump light is separate from the wavelength conversion device, it is difficult to ensure that the phase-matching condition is satisfied. Careful design and tight manufacturing tolerances are necessary, and the wavelength conversion apparatus must operate in a strictly controlled environment.

If signal light is also introduced into the waveguide, interactions between the signal light and pump light can produce light with their sum or difference frequency. In this case, in addition to the problems described above, there is the problem of polarization sensitivity: the conversion efficiency depends on the plane of polarization of the signal light, which is inconvenient in many practical systems.

SUMMARY OF THE INVENTION

It is accordingly an object of the present invention to provide an efficient wavelength conversion apparatus.

Another object of the invention is to provide a wavelength conversion apparatus that can easily be adjusted for maximum conversion efficiency.

A further object is to simplify the design of a wavelength conversion apparatus.

A still further object is to provide a polarization-insensitive wavelength conversion apparatus.

According to a first aspect of the invention, a wavelength conversion apparatus comprises an optical ring resonator in which light travels repeatedly around an optical path having the form of a ring. An optical amplifier, a wavelength converter, and an optical coupler are disposed on the optical path. The optical path is formed, for example, by optical fiber, preferably by polarization-maintaining optical fiber.

The optical amplifier amplifies light having a first wavelength. The wavelength converter transmits light of the first wavelength, thereby feeding this light back around the ring to the optical amplifier, but converts part of the transmitted light from the first wavelength to a second wavelength. The optical coupler extracts light of the second wavelength as output of the wavelength conversion apparatus.

An optical bandpass filter that transmits only light of the first wavelength is preferably also disposed in the ring. The bandpass filter is preferably tunable.

The optical amplifier is, for example, a semiconductor optical amplifier that not only amplifies light of the first wavelength, but also generates light of this wavelength by amplified spontaneous emission. The wavelength converter comprises, for example, a waveguide and domain inversion grating formed in a non-linear optical crystal.

The wavelength converter operates as, for example, a second-harmonic generator, in which case the first wavelength is twice the second wavelength.

Alternatively, the wavelength converter operates as an optical element, such as a sum-frequency generator or difference-frequency generator, that generates light of the second wavelength by an interaction between light of the first wavelength and light of a third wavelength. Signal light having the third wavelength is coupled into the optical path from a signal source, preferably through a polarizing beam-splitter that separates the signal light into two polarized components, and a polarization rotator that rotates the polarization of one of the polarized components to match the polarization of the other component. The two polarized components are preferably directed into opposite ends of the wavelength converter.

The polarizing beam-splitter and polarization rotator may also function as part of the above-mentioned optical coupler. In this case, the optical coupler can be adapted to extract light of the second wavelength traveling in both directions on the optical path in the optical resonator.

According to a second aspect of the invention, a wavelength conversion apparatus comprises a pump light source for generating light having a first wavelength and a fixed linear polarization, a wavelength converter for converting the first wavelength to a second wavelength by interaction with light of a third wavelength, and a polarization beam splitter and polarization rotator as described above, for supplying light of the third wavelength to the wavelength converter.

By placing both the optical amplifier and the wavelength converter in the same optical ring resonator, the first aspect of the invention efficiently converts light from the first wavelength to the second wavelength. Extraction of light traveling in both directions further enhances the conversion efficiency.

When the optical ring resonator includes a tunable bandpass filter, the wavelength conversion device can easily be adjusted for maximum conversion efficiency, by tuning the bandpass filter.

When signal light is coupled through a polarizing beam-splitter and polarization rotator in the first or second aspect of the invention, the conversion efficiency is insensitive to the polarization of the signal light.

DETAILED DESCRIPTION OF THE INVENTION

Embodiments of the invention will be described with reference to the attached illustrative drawings.
First Embodiment The first embodiment generates light with a first wavelength or fundamental wavelength $\lambda_1$, converts part of this light to light with a second wavelength or second harmonic wavelength $\lambda_2$, and generates the converted light. Light of the first and second wavelengths will also be referred to as the fundamental wave and second harmonic wave, respectively, and the optical power of these waves will be referred to as fundamental power and second harmonic power. The fundamental wave may also be referred to as pump light, and the second wave as converted light.

Figure 1:
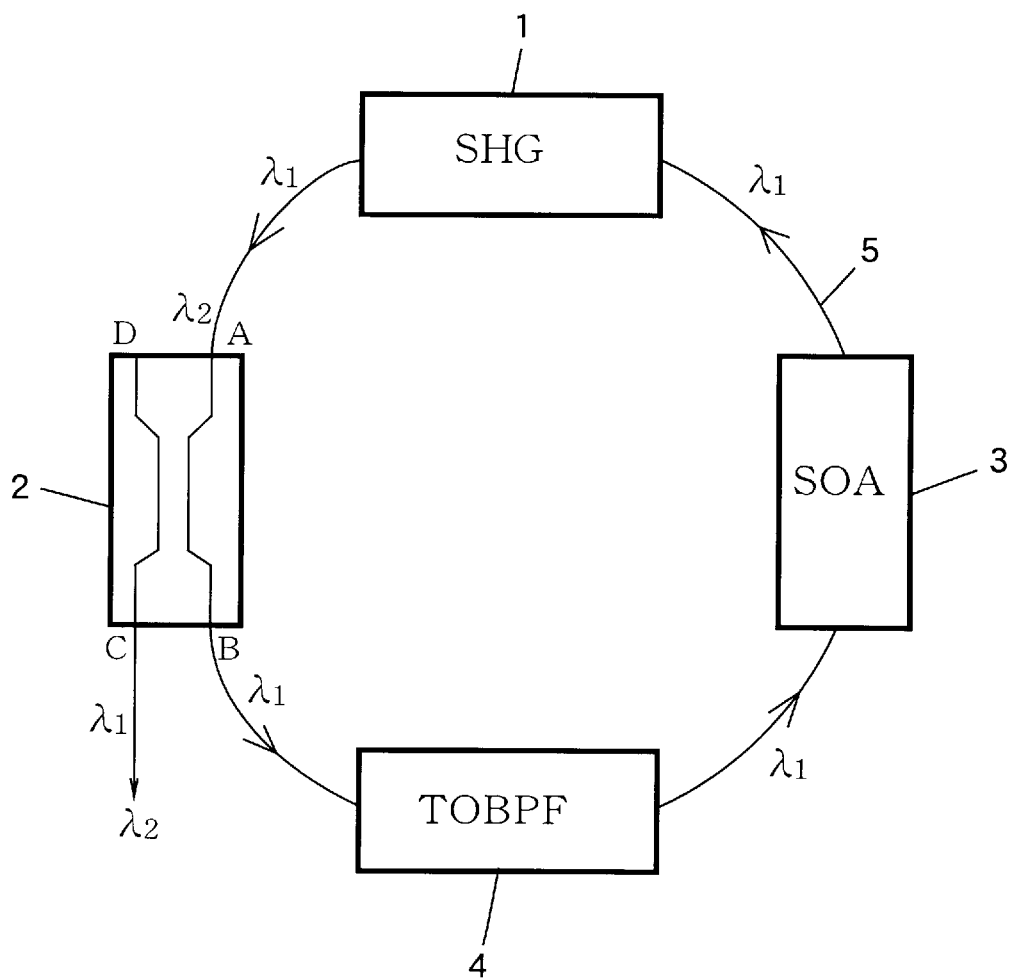
FIG. 1 schematically illustrates a first embodiment of the invention.

Referring to FIG. 1, the first embodiment comprises a second-harmonic generation (SHG) wavelength converter 1, a directional coupler 2, a semiconductor optical amplifier (SOA) 3, and a tunable optical bandpass filter (TOBPF) 4, which are coupled by polarization-maintaining optical fiber 5 into a ring.

Figure 2:
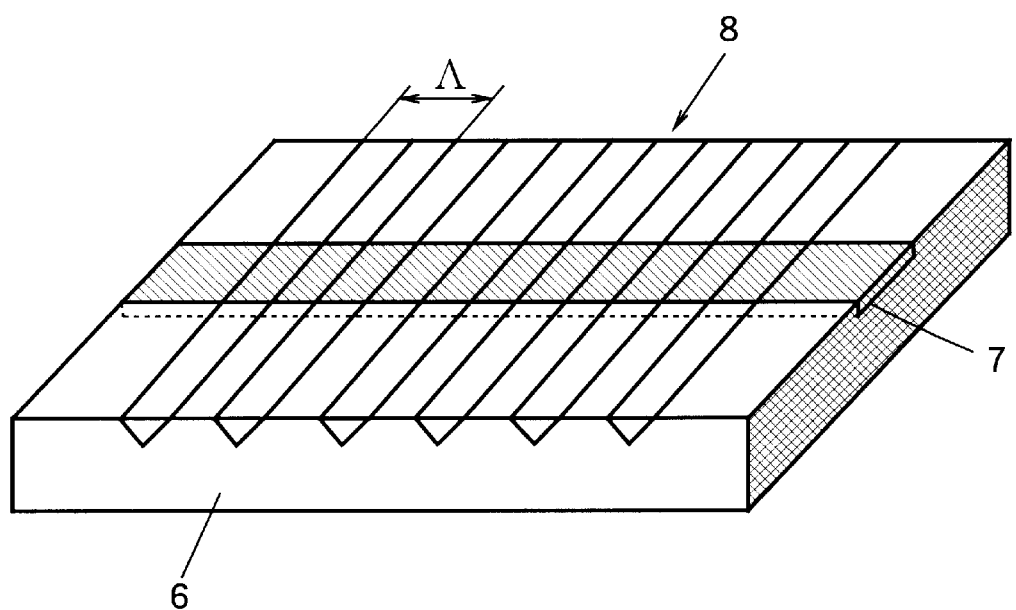
FIG. 2 shows the structure of the wavelength converter used in the embodiments.

The SHG wavelength converter 1 receives the fundamental wave ($\lambda_1$) from the semiconductor optical amplifier 3, and provides both fundamental and harmonic waves ($\lambda_1$ and $\lambda_2$) to the directional coupler 2. Referring to FIG. 2, the SHG wavelength converter 1 is a known integrated optic device comprising a substrate 6 of a crystalline lithium-niobate (LiNbO$_3$), and a waveguide 7 and domain inversion grating 8 formed in the substrate 6. The waveguide 7 is formed by proton exchange. The domain inversion grating 8 is formed, for example, by diffusion of a material that alters the natural polarization direction of the substrate 6. The diffusion is masked to form mutually parallel stripes oriented at right angles to the waveguide 7, with a repeating period of $\Lambda$.

Referring again to FIG. 1, the directional coupler 2 is a well-known device with two integrated waveguides disposed proximate to one another, so that optical tunneling can occur between them. One waveguide terminates at ports A and B, while the other terminates at ports C and D. The SHG wavelength converter 1 is linked by the polarization-maintaining optical fiber 5 to port A, the tunable optical bandpass filter 4 is linked by the polarization-maintaining optical fiber 5 to port B, and port C is the output port of the apparatus. Port D is not used.

The semiconductor optical amplifier 3 is a well-known device generally similar in structure to a semiconductor laser, but with anti-reflection coatings instead of reflective coatings or gratings at both ends. The tunable optical bandpass filter 4 is a filter of the dielectric multilayer type, tunable over a certain range of wavelengths including $\lambda_1$ by adjustment of the angular orientation of the filter.

Although the first embodiment is not limited to any specific values of $\lambda_1$ and $\lambda_2$, polarization-maintaining fiber and other optical components designed for operation in the vicinity of 1.55 micrometers (1.55 $\mu$m) are readily available, so in the following description of this embodiment, $\lambda_1$ is 1.54 $\mu$m and $\lambda_2$ is 0.77 $\mu$m. The repeating period $\Lambda$ of the domain inversion grating 8 is substantially 18 $\mu$m.

Next, the operation of the first embodiment will be explained.

When current is injected into the semiconductor optical amplifier 3, the resulting electric field raises electrons in the semiconductor optical amplifier 3 to excited states, from which they spontaneously return to the normal state by emitting photons. Traveling around the ring through the SHG wavelength converter 1, directional coupler 2, and tunable optical bandpass filter 4, some of these photons re-enter the semiconductor optical amplifier 3, where they stimulate other excited electrons to emit further photons with the same phase and wavelength. The spontaneous emission of the semiconductor optical amplifier 3 is thereby amplified: a process of amplified spontaneous emission (ASE) occurs.

The semiconductor optical amplifier 3 supports amplified spontaneous emission over a wavelength range of substantially one hundred nanometers (100 nm), from about 1.5 $\mu$m to about 1.6 $\mu$m, but returning photons are limited to the passband of the tunable optical bandpass filter 4. The optical bandpass filter 4 employed in the first embodiment has, for example, a passband less than one nanometer wide, tunable in a range from 1.53 $\mu$m to 1.56 $\mu$m. The light re-entering the semiconductor optical amplifier 3 is thus limited to a narrow spectral line at or near 1.54 $\mu$m. This spectral line defines the fundamental wavelength $\lambda_1$.

The gain of the semiconductor optical amplifier 3 at 1.55 $\mu$m is substantially twenty decibels (20 dB). The gain at the wavelength $\lambda_1$ is slightly less, but exceeds the round-trip loss in the ring. The entire apparatus therefore operates as a fiber-ring laser resonator, in which light amplification by stimulated emission of radiation takes place at the fundamental wavelength $\lambda_1$. The light received by the SHG wavelength converter 1 from the semiconductor optical amplifier 3 consists almost entirely of light of wavelength $\lambda_1$.

The difference in refractive index between the waveguide 7 and substrate 6 of the SHG wavelength converter 1 depends on the mode of propagation, being larger for light propagating in the transverse magnetic (TM) mode than for light propagating in the transverse electric (TE) mode. The TM component of incident light is guided by the waveguide 7, while the TE component is dispersed into the substrate 6. The light emitted and amplified by the semiconductor optical amplifier 3 is linearly polarized. The semiconductor optical amplifier 3 and SHG wavelength converter 1 are coupled by the polarization-maintaining optical fiber 5 so that the light provides to the SHG wavelength converter 1 propagates in the TM mode, and is therefore guided in the waveguide 7, where second-harmonic generation occurs.

Second-harmonic generation occurs with maximum efficiency when the wave vectors $k_1$ and $k_2$ of the fundamental wave and second harmonic wave in the waveguide 7 satisfy the following quasi-phase-matching (QPM) condition for some positive integer m.

$$k_2 - 2k_1 - 2\pi(2m-1)/\Lambda = 0$$

The 18-μm spacing $\Lambda$ of the domain inversion grating 8 enables this condition to be satisfied at a wavelength $\lambda_1$ of substantially 1.54 μm. More specifically, the spacing $\Lambda$ has been selected so that $\Lambda/2$ is an odd multiple of the coherence length $l_c$ given by the following equation, in which $\lambda$ is the wavelength of the fundamental wave in a vacuum, $N(\lambda)$ is the refractive index of the waveguide 7 at this wavelength, and $N(\lambda/2)$ is the refractive index of the waveguide 7 at the wavelength $\lambda/2$.

$$l_c = \lambda/4[N(\lambda/2) - N(\lambda)]$$

The light exiting the SHG wavelength converter 1 and entering port A of the directional coupler 2 comprises both the fundamental wavelength $\lambda_1$ and second harmonic wavelength $\lambda_2$. The directional coupler 2 operates as a three-decibel (3-dB) coupler in the 1.55-μm band; that is, the interaction length of the two waveguides in the directional coupler 2 is designed so that for wavelengths in the vicinity of 1.55 μm, approximately half of the incident light tunnels between the two waveguides. At the shorter wavelength of 0.77 μm, however, approximately ninety per cent (90%) of the incident light tunnels to the other waveguide. Thus the fundamental wave ($\lambda_1$) received at port A is split approximately equally between ports B and C, while the second harmonic wave ($\lambda_2$) is almost entirely coupled from port A to the output port C.

The light coupled to port B is guided by the polarization-maintaining optical fiber 5 to the tunable optical bandpass filter 4, which rejects the small remaining second harmonic component and feeds only light of the sharply defined fundamental wavelength $\lambda_1$ back to the semiconductor optical amplifier 3 for further amplification, as described above.

The output of the first embodiment at port C comprises both fundamental and second harmonic components. If necessary, the fundamental component can be removed with a filter (not shown in the drawing).

An advantage of first embodiment is that since the SHG wavelength converter 1 is disposed within the optical ring resonator, the fundamental wave is cycled repeatedly through the SHG wavelength converter 1. This greatly increases the conversion efficiency, as compared with conventional apparatus that passes the fundamental wave through the wavelength converter only once. Efficiency is also increased as compared with conventional apparatus that uses reflecting means to confine the fundamental wave in the wavelength converter and thereby limits the fundamental power entering the wavelength converter.

A further advantage is that there is no need to determine the optimum reflectivities of these conventional reflecting means. Thus the design of the wavelength conversion apparatus is simplified.

A still further advantage is that the maximum conversion efficiency can be easily obtained by tuning the optical bandpass filter 4. It is not necessary for the optical components to be designed and manufactured with high precision, or for the apparatus to be operated under strict environmental control. Adjustment of the tunable optical bandpass filter 4 enables precise satisfaction of the QPM condition to be achieved even if the apparatus is manufactured to comparatively loose tolerances and operated under a variety of environmental conditions.

Second Embodiment

Figure 3:
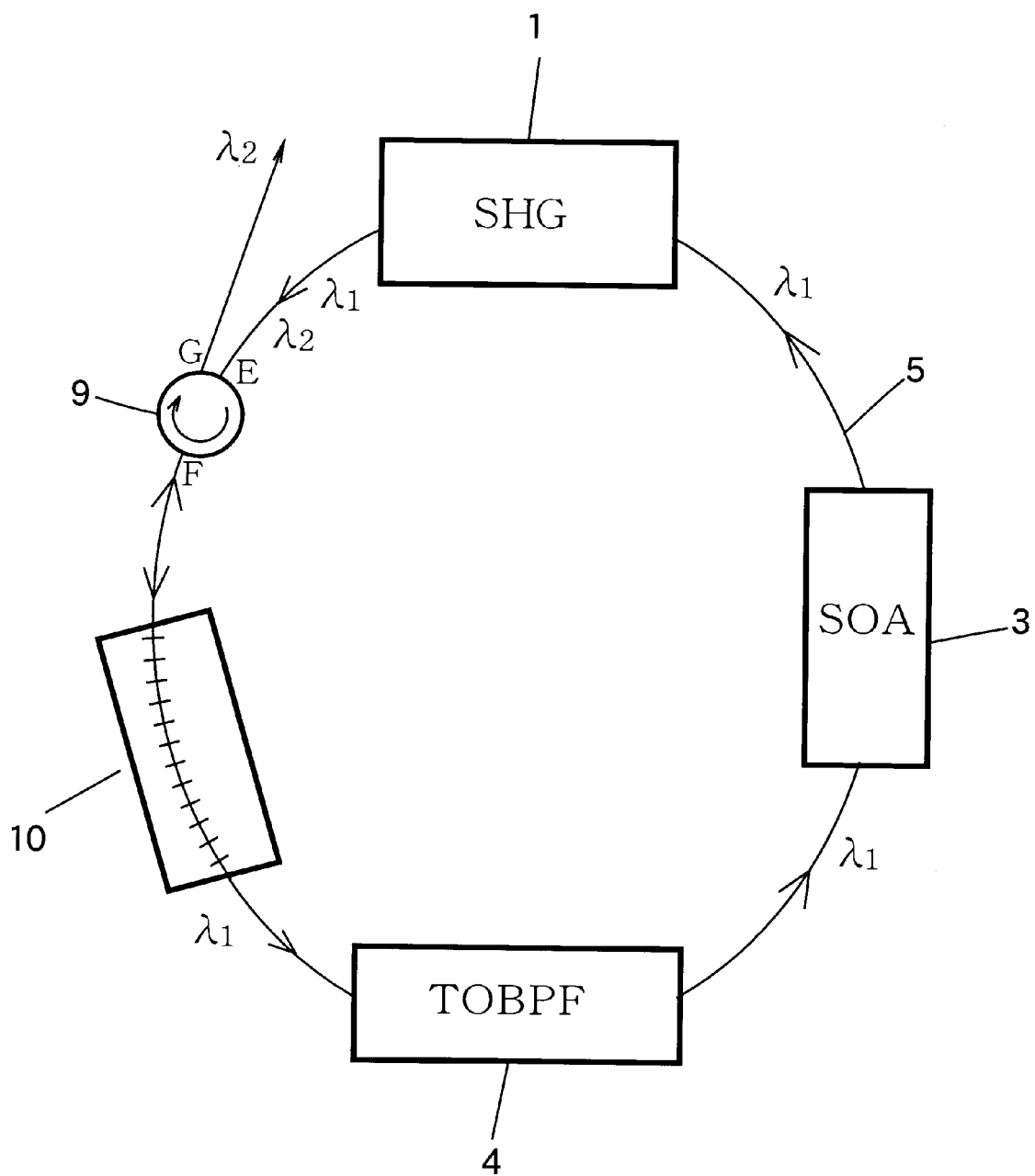
FIG. 3 schematically illustrates a second embodiment.

FIG. 3 shows a second embodiment of the invention, employing the same reference numerals as in FIG. 1 for the SHG wavelength converter 1, semiconductor optical amplifier 3, tunable optical bandpass filter 4, and polarization-maintaining optical fiber 5. These components operate in the same way as in the first embodiment.

In place of the directional coupler 2 of the first embodiment, the second embodiment has an optical circulator 9 and a fiber grating 10. These two components combine to operate as an optical coupler, as follows.

The optical circulator 9 is a type of optical gyrator with three ports E, F, and G. Light incident at port E is coupled out at port F, and light incident at port F is coupled out at port G. Port E is coupled by the polarization-maintaining optical fiber 5 to the SHG wavelength converter 1, port F is coupled by the polarization-maintaining optical fiber 5 to the fiber grating 10, and port G is the output port of the apparatus.

The fiber grating 10 is a distributed Bragg reflector with a grating spacing equal to the half the second harmonic wavelength $\lambda_2$, or to an odd multiple of half the second harmonic wavelength $\lambda_2$. Light of wavelength $\lambda_2$ generated in the SHG wavelength converter 1 reaches the fiber grating 10 through the optical circulator 9 and is partially reflected at each corrugation in the fiber grating 10. The optical path lengths of light reflected from adjacent corrugations differ by an amount equal to $\lambda_2$, or an odd multiple thereof, so the reflected light interferes constructively. The fiber grating 10 has sufficient length that substantially all of the second harmonic power incident from the direction of port F of the optical circulator 9 is reflected back to port F of the optical circulator 9, and exits the apparatus at port G of the optical circulator 9.

Since $\lambda_2$ is one-half of $\lambda_1$, when the fundamental wave is reflected in the fiber grating 10, light reflected from adjacent corrugations interferes destructively. Accordingly, the fiber grating 10 operates as a selective reflector: substantially none of the fundamental power is reflected back to port F of the optical circulator 9; substantially all of the fundamental power is transmitted through the fiber grating 10 to the tunable optical bandpass filter 4.

The overall operation of the second embodiment is similar to that of the first embodiment, except that substantially no fundamental power is lost through the output port G. The semiconductor optical amplifier 3 is accordingly able to operate at substantially its saturation power level, and the intensity of the fundamental wave in the waveguide 7 in the SHG wavelength converter 1 is increased. Since the intensity of the second harmonic wave generated in the SHG wavelength converter 1 is proportional to the square of the intensity of the fundamental wave, the overall conversion efficiency is significantly improved.

A further advantage of the second embodiment is that the output at port G comprises substantially the second harmonic wave alone, with no fundamental component.

Third Embodiment

The third embodiment receives signal light and generates converted light with a slightly different wavelength. For example, the third embodiment can receive signal light with a wavelength of 1.53 μm and generate converted light with a wavelength of 1.55 μm.

Figure 4:
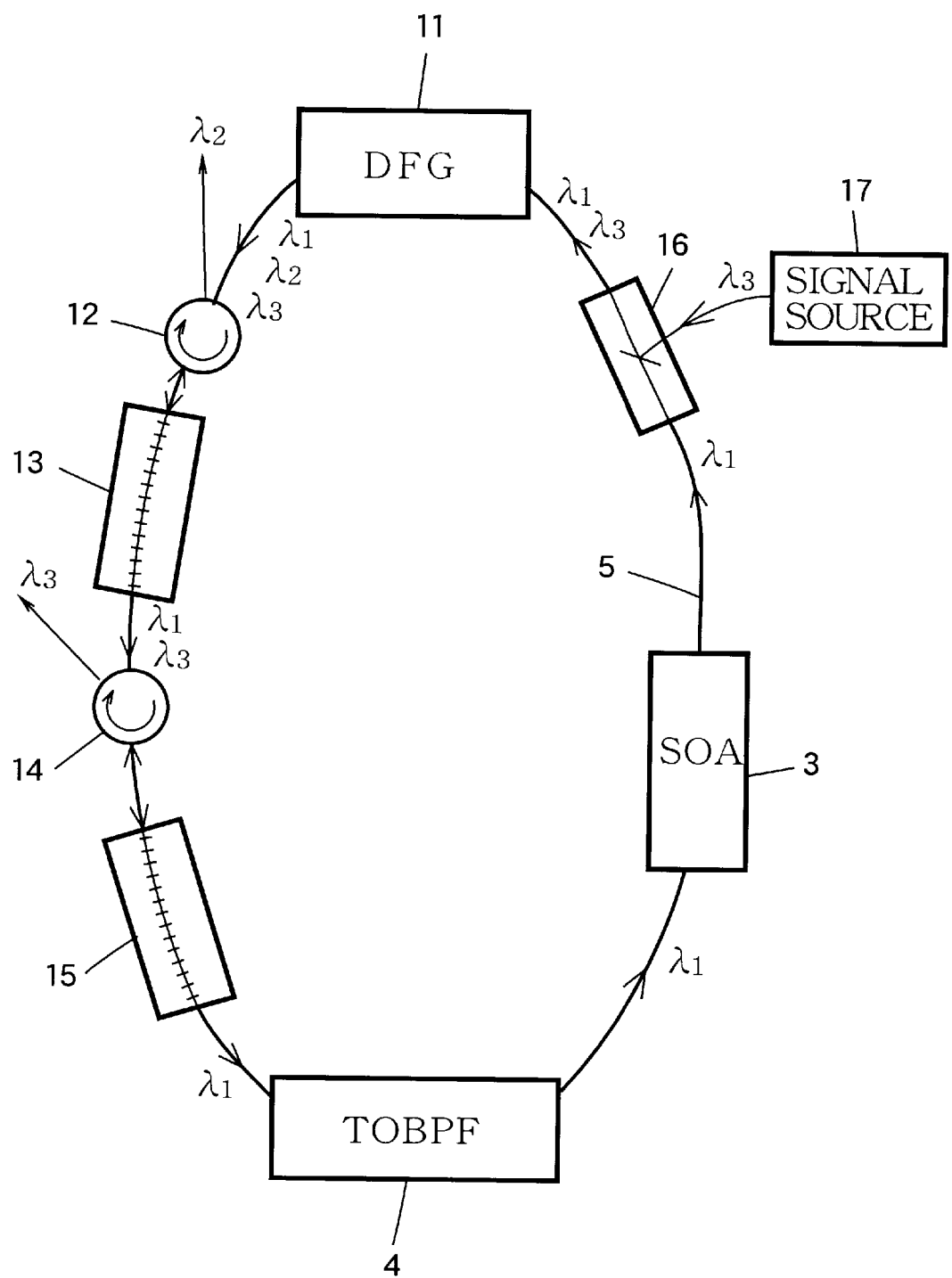
FIG. 4 schematically illustrates a third embodiment.

FIG. 4 shows the configuration of third embodiment, using the same reference numerals as in FIG. 1 for the semiconductor optical amplifier 3, tunable optical bandpass filter 4, and polarization-maintaining optical fiber 5. These components operate in substantially the same way as in the first embodiment, but at different wavelengths, as described below.

The wavelength converter in the third embodiment is a DFG wavelength converter 11 that receives both pump light having a wavelength $\lambda_1$ from the semiconductor optical amplifier 3 and signal light having a wavelength $\lambda_3$, and generates light with a wavelength $\lambda_2$ such that, within the DFG wavelength converter 11, the frequency of the generated light is equal to the difference of the frequencies of the pump light and signal light. The structure of the DFG wavelength converter 11 is similar to the structure shown in FIG. 2, and the spacing A of the domain inversion grating 8 has the same value of 18 μm, but the QPM condition is now given by the following equation, where $k_1$, $k_2$, and $k_3$ are the wave numbers of the pump light, converted light, and signal light, respectively.

$$k_1-k_2-k_3=2\pi/\Lambda$$

The law of conservation of energy places the following requirement on the wavelengths $\lambda_1$, $\lambda_2$, and $\lambda_3$ of the pump light, converted light, and signal light.

$$1/\lambda_1=1/\lambda_2+1/\lambda_3$$

In the following description, $\lambda_1$ will be 0.77 μm, $\lambda_2$ will be 1.53 μm, and $\lambda_3$ will be 1.55 μm.

The semiconductor optical amplifier 3 used in the third embodiment amplifies wavelengths in the 0.78-μm band, from approximately 0.76 μm to approximately 0.80 μm. The tunable optical bandpass filter 4 is tunable over a range of wavelengths including 0.77 μm. The polarization-maintaining optical fiber 5 is 0.8-μm-band polarization-maintaining optical fiber, instead of the 1.55-μm-band polarization-maintaining fiber used in the first two embodiments.

The third embodiment comprises a first optical circulator 12 and fiber grating 13 that combine to operate as an optical coupler for extracting converted light, as explained in the second embodiment. The grating spacing of the fiber grating 13 is designed for reflection of light with wavelength $\lambda_2$ (1.53 μm).

The third embodiment also comprises a second optical circulator 14 and fiber grating 15 that extract signal light. The grating spacing of the fiber grating 15 is designed for reflection of light with wavelength $\lambda_3$ (1.55 μm).

Signal light is provided to the ring through an input coupler, in this case a wavelength-division multiplexing (WDM) coupler 16, at a point between the semiconductor optical amplifier 3 and DFG wavelength converter 11. The WDM coupler 16 comprises a dichroic mirror which is transparent at wavelengths around $\lambda_1$, but highly reflective at wavelengths around $\lambda_3$. The signal light is produced by a signal source 17 such as a semiconductor laser.

The third embodiment operates as a fiber-ring laser resonator at a wavelength $\lambda_1$, substantially equal to 0.77 μm, which is adjusted by the tunable optical bandpass filter 4 so as to obtain maximum converted output power at wavelength $\lambda_2$. The pump light produced by laser resonance is combined with signal light of wavelength $\lambda_3$ (1.55 μm) by the WDM coupler 16, substantially without loss at either wavelength $\lambda_1$ or $\lambda_3$. Difference-frequency generation takes place in the DFG wavelength converter 11 according to the QPM condition given above, producing converted light with wavelength $\lambda_2$ (1.53 μm).

The reflectivity characteristics of the fiber gratings 13 and 15 are highly selective. The optical coupler comprising optical circulator 12 and fiber grating 13 is accordingly able to extract almost all of the converted light with wavelength $\lambda_2$ (1.53 μm) while transmitting substantially all of the received pump light and signal light with wavelengths $\lambda_1$ and $\lambda_3$ (0.77 μm and 1.55 μm) to optical circulator 14. Similarly, optical circulator 14 and fiber grating 15 extract substantially all of the received signal light ($\lambda_3$), and transmit substantially all of the received pump light ($\lambda_1$) to the tunable optical bandpass filter 4.

The advantages of the third embodiment are similar to the advantages of the first and second embodiments: high conversion efficiency, easy adjustment for maximum conversion efficiency, and simple design. It should be noted, however, that the conversion efficiency of the third embodiment is sensitive to the polarization of the signal light, being maximum when the signal light is polarized so as to propagate in the TM mode in the DFG wavelength converter 11.

Fourth Embodiment

The fourth embodiment eliminates the polarization sensitivity of the third embodiment.

Figure 5:
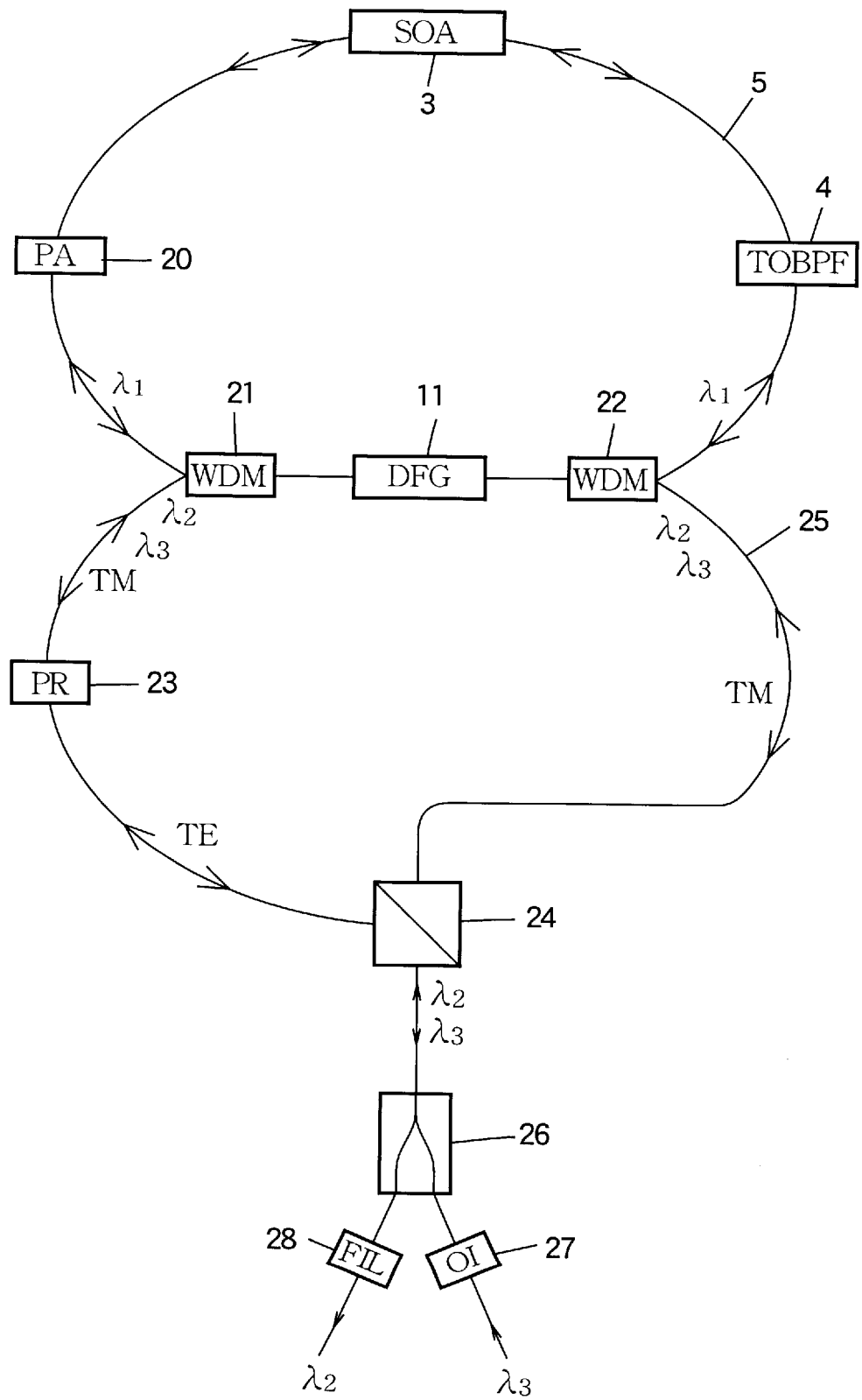
FIG. 5 schematically illustrates a fourth embodiment.

Referring to FIG. 5, the fourth embodiment comprises a semiconductor optical amplifier 3, tunable optical bandpass filter 4, polarization-maintaining optical fiber 5 and DFG wavelength converter 11, which operate as in the third embodiment to generate converted light of wavelength $\lambda_2$ from pump light of wavelength $\lambda_1$ and signal light of wavelength $\lambda_3$. In the following description, $\lambda_1$, $\lambda_2$, and $\lambda_3$ will be 0.77 μm, 1.53 μm, and 1.55 μm, as in the third embodiment.

The ring resonator formed by the polarization-maintaining optical fiber 5 in the fourth embodiment also includes a phase adjuster 20, and a pair of WDM couplers 21 and 22. WDM couplers 21 and 22 are disposed at opposite ends of the DFG wavelength converter 11. WDM coupler 21 couples light of wavelengths in the vicinity of 0.77 μm ($\lambda_1$) between the DFG wavelength converter 11 and the phase adjuster 20, and couples light of wavelengths in the vicinity of 1.54 μm, including wavelengths $\lambda_2$ and $\lambda_3$, between the DFG wavelength converter 11 and a polarization rotator 23. WDM coupler 22 operates similarly, coupling light of wavelengths in the vicinity of 0.77 μm between the DFG wavelength converter 11 and the tunable optical bandpass filter 4, and light of wavelengths in the vicinity of 1.54 μm between the DFG wavelength converter 11 and a polarization beam splitter 24. The WDM couplers 21 and 22, polarization rotator 23, and polarization beam splitter 24 are interconnected by 1.55-μm-band polarization-maintaining optical fiber 25, forming a second ring.

The polarization beam splitter 24 is connected by optical fiber to a branching waveguide coupler 26. Signal light of wavelength $\lambda_3$ is provided to the branching waveguide coupler 26 through an optical isolator (OI) 27, while converted light is generated from the branching waveguide coupler 26 through a filter (FIL) 28.

The WDM couplers 21 and 22, polarization rotator 23, polarization beam splitter 24, polarization-maintaining optical fiber 25, branching waveguide coupler 26, optical isolator 27, and filter 28 constitute an optical input/output coupler that provides both input signal light to the optical ring resonator formed by polarization-maintaining optical fiber 5, and output converted light from this ring resonator.

Next, the operation of the fourth embodiment will be described.

Signal light with wavelength $\lambda_3$ from the signal source (not shown) passes substantially without loss through the optical isolator 27 and branching waveguide coupler 26, and is split by the polarization beam splitter 24 into two linearly polarized components with mutually perpendicular planes of polarization. These two components will be referred to as the TE component and the TM component, because the TM component is coupled through WDM coupler 22 into the DFG wavelength converter 11 so as to propagate in the TM mode in the DFG wavelength converter 11.

The TE component is guided from the polarization beam splitter 24 to the polarization rotator 23, which rotates the plane of polarization by 90°. The TE component is thereby converted to another TM component, which is coupled through WDM coupler 21 into the DFG wavelength converter 11, and also propagates in the TM mode in the DFG wavelength converter 11.

The fiber-ring resonator comprising the semiconductor optical amplifier 3, tunable optical bandpass filter 4, and polarization-maintaining optical fiber 5 operates as described in the preceding embodiments to produce pump light with wavelength $\lambda_1$. In the preceding embodiments, this pump light was shown as propagating in only one direction around the ring, but the pump light actually propagates in both directions, and both directions are used in the fourth embodiment.

The phase adjuster 20 adjusts the phase of the pump light, for a reason that will be explained below. Various types of electro-optic phase adjusters can be employed. For example, a waveguide formed in a gallium-arsenide, gallium-aluminum-arsenide, lithium niobate, or polymer substrate can alter the phase of propagating light by an amount controlled by an applied electrical voltage. Such devices are commonly used as phase modulators, but can also be used for phase adjustment, as in the present embodiment.

The pump light propagating in both directions through the DFG wavelength converter 11 interacts with the signal light propagating in both directions to produce converted light of wavelength $\lambda_2$. Signal light and converted light propagating in the TM mode leave the DFG wavelength converter 11 at both ends, and are coupled by WDM couplers 21 and 22 to follow in reverse the two paths taken by signal light entering the apparatus. On one of these two paths, the plane of polarization of the light is rotated 90° by the polarization rotator 23. The light returning to the polarization beam splitter 24 on the two paths is recombined in the polarization beam splitter 24 and directed into the branching waveguide coupler 26.

In order for the converted light to be recombined, the phase of the converted light must be adjusted so that the converted light is in phase on the two paths. This phase adjustment is carried out by adjusting the phase of the pump light with the phase adjuster 20. Maximum conversion efficiency can then be obtained by adjusting the tunable optical bandpass filter 4.

The converted light and returning signal light entering the branching waveguide coupler 26 from the polarization beam splitter 24 are both split substantially equally between the port connected to the optical isolator 27 and the port connected to the filter 28. The optical isolator 27 prevents any of this light from returning to the signal source, thereby preventing unwanted returning light from interfering with the operation of the signal source. The filter 28 filters out returning signal light with wavelength $\lambda_3$, and transmits only converted light with wavelength $\lambda_2$ as the output of the apparatus.

The power $P_c$ of the converted light generated at each end of the DFG wavelength converter 11 in the fourth embodiment is related to the power $P_s$ of the signal light and the power $P_p$ of the pump light by the following equation, in which $\eta$ is a constant expressing the efficiency of the conversion process.

$$P_c = \eta P_s P_p$$

The combined optical power of the converted light leaving the DFG wavelength converter 11 in both directions is insensitive to the polarization of the signal light if the DFG wavelength converter 11 is disposed at a point in the optical ring resonator where the intensity or power $P_p$ of the pump light traveling in both directions is equal. This equality condition is easily achieved in a ring resonator. If the propagation loss of pump light in the tunable optical bandpass filter 4 is not equal to the propagation loss in the phase adjuster 20, the losses can be equalized by inserting an optical attenuator into the ring.

The polarization insensitivity of the fourth embodiment is a significant advantage, since in many practical situations it is not possible to control the polarization of the incoming signal light. A further advantage of the fourth embodiment is enhanced conversion efficiency, because light propagating in both directions in the optical ring resonator is used.

In addition to being insensitive to the polarization of the signal light, the fourth embodiment can also convert signal light of a variety of different wavelengths. For example, without changing the wavelength of the pump light, the fourth embodiment can convert signal light with a wavelength of 1.53 μm to output light with a wavelength of 1.55 μm, convert signal light with a wavelength of 1.57 μm to output light with a wavelength of 1.51 μm, and so on.

Fifth Embodiment

Figure 6:
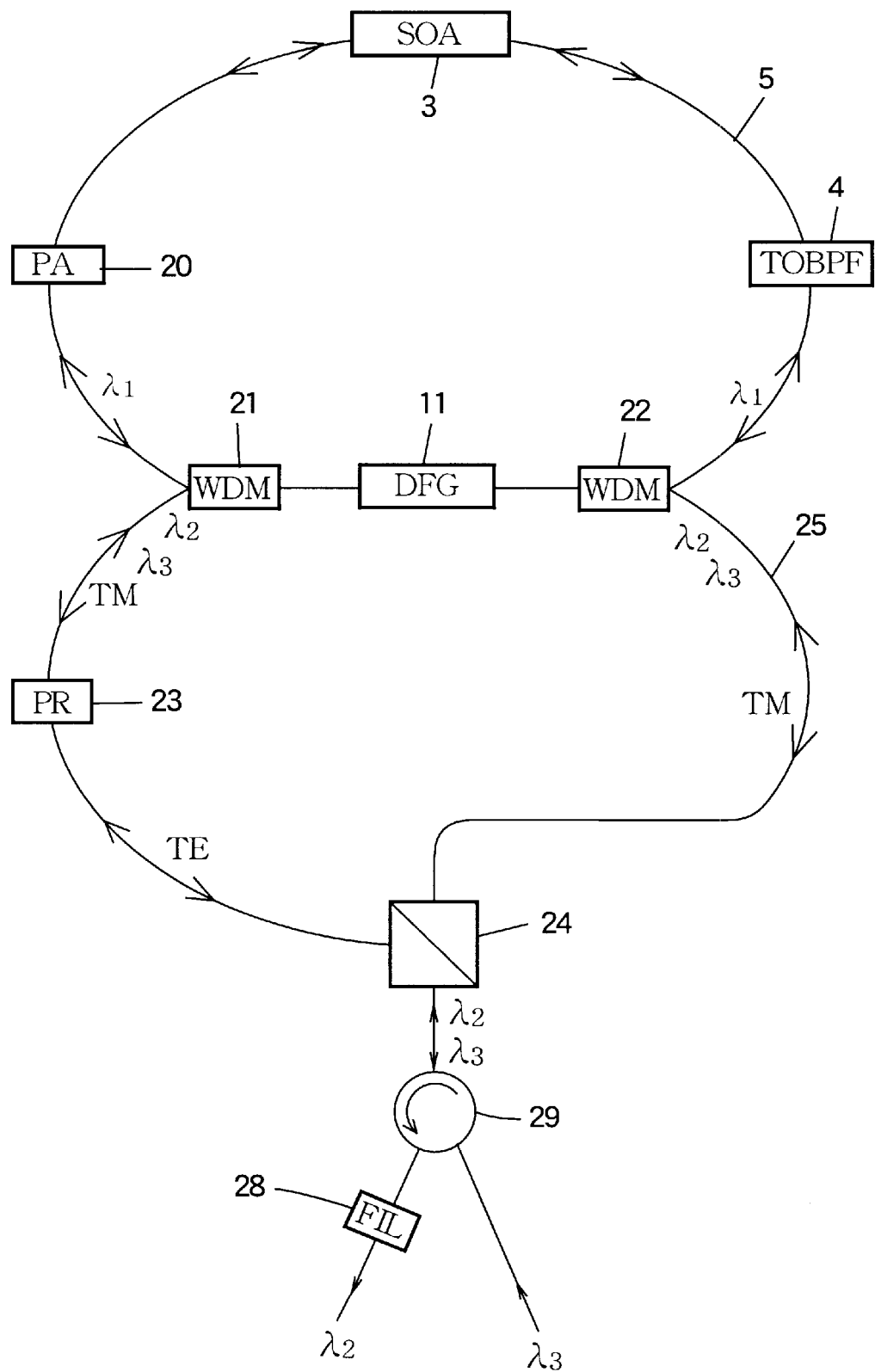
FIG. 6 schematically illustrates a fifth embodiment.

FIG. 6 shows a fifth embodiment of the invention, using the same reference numerals as in FIG. 5 for the semiconductor optical amplifier 3, tunable optical bandpass filter 4, polarization-maintaining optical fiber 5, DFG wavelength converter 11, phase adjuster 20, WDM couplers 21 and 22, polarization rotator 23, polarization beam splitter 24, polarization-maintaining optical fiber 25, and filter 28. These components operate in the same way as in the fourth embodiment.

The fifth embodiment replaces the branching waveguide coupler of the fourth embodiment with an optical circulator 29, and eliminates the optical isolator 27 employed in the fourth embodiment. Input signal light is guided directly into the optical circulator 29, thence to the polarization beam splitter 24. Returning signal light and converted light reaching the optical circulator 29 from the polarization beam splitter 24 are routed to the filter 28, which blocks the returning signal light and transmits the converted light as output light.

The fifth embodiment is advantageous in that all of the converted light is obtained as output light, and no separate optical isolator is required to block returning signal light from the signal source.

Sixth Embodiment

Figure 7:
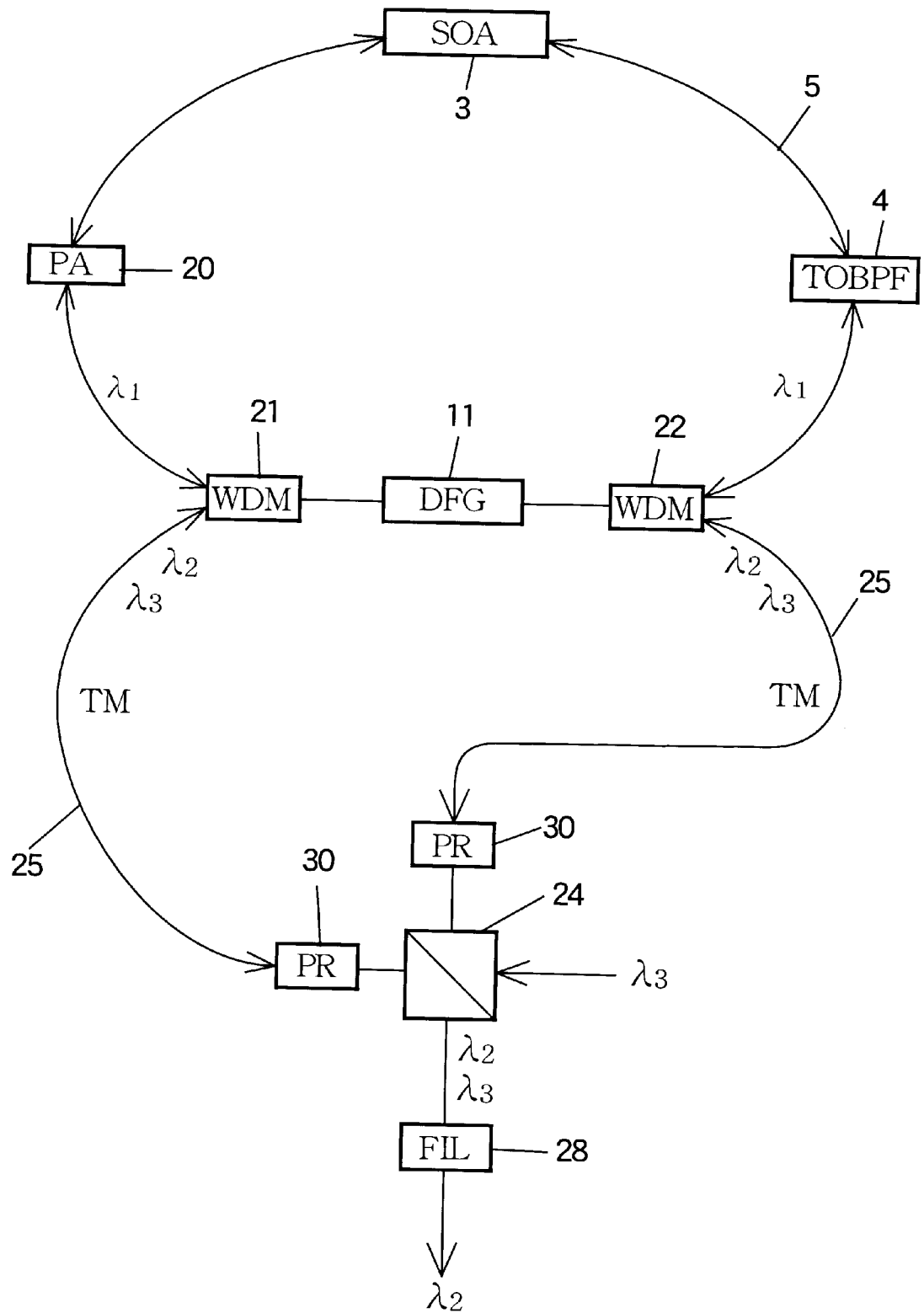
FIG. 7 schematically illustrates a sixth embodiment.

FIG. 7 shows the sixth embodiment, using the same reference numerals as in FIG. 5 for the semiconductor optical amplifier 3, tunable optical bandpass filter 4, polarization-maintaining optical fiber 5, DFG wavelength converter 11, phase adjuster 20, WDM couplers 21 and 22, polarization beam splitter 24, polarization-maintaining optical fiber 25, and filter 28. These components operate in the same way as in the fourth embodiment.

In place of the 90° polarization rotator of the fourth embodiment, the sixth embodiment has a pair of 45° polarization rotators 30. These are coupled to WDM couplers 21 and 22 by the polarization-maintaining optical fiber 25 in such a way that after undergoing a 45° rotation in either polarization rotator 30, the signal light coupled into the DFG wavelength converter 11 propagates in the TM mode.

After difference-frequency generation, converted light and signal light returning to the polarization rotators 30 undergo an opposite 45° rotation. As a result, light entering the polarization beam splitter 24 from either polarization rotator 30 is polarized at right angles to the light that left the polarization beam splitter 24 to enter the same polarization rotator 30. The converted light and returning signal light therefore exit the polarization beam splitter 24 in a different direction from the entering signal light, as shown.

The filter 28 blocks the returning signal light so that the output of the apparatus comprises only converted light with wavelength $\lambda_2$.

As in the fifth embodiment, no optical isolator is needed to prevent signal light or converted light from returning to the signal source.

The input/output coupling schemes used to achieve polarization insensitivity in the fourth, fifth, and sixth embodiments are not limited to use with optical ring resonators. Examples of their use with another type of resonator will be shown in the next two embodiments.

Seventh Embodiment

Figure 8:
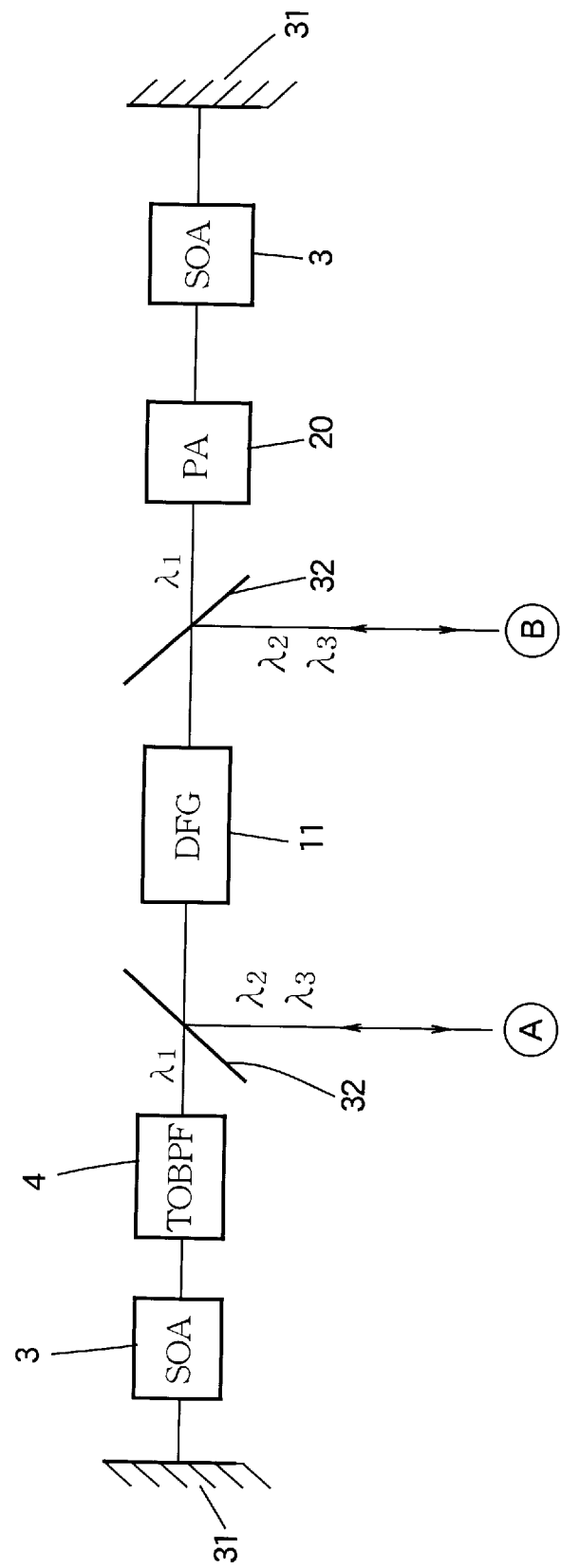
FIG. 8 schematically illustrates a first part of a seventh embodiment.

FIG. 8 shows the optical resonator employed in the seventh embodiment, using the same reference numerals as in the fourth, fifth, and sixth embodiments for the semiconductor optical amplifier 3, tunable optical bandpass filter 4, DFG wavelength converter 11, and phase adjuster 20. Two semiconductor optical amplifiers 3 are now employed. These components are aligned on an optical path having totally reflecting mirrors 31 at both ends, forming a Fabry-Perot resonator. Also disposed on this optical path, on either side of the DFG wavelength converter 11, are a pair of dichroic mirrors 32 that transmit light in the 0.8-µm band, including pump light of wavelength $\lambda_1$, and reflect light in the 1.55-µm band, including converted light and signal light of wavelengths $\lambda_2$ and $\lambda_3$. These dichroic mirrors 32 thus operate as parts of an optical input/output coupler that couples signal light into the optical resonator from the two points indicated by the circled letters A and B, and couples converted light and returning signal light out at the same two points A and B.

Figure 9:
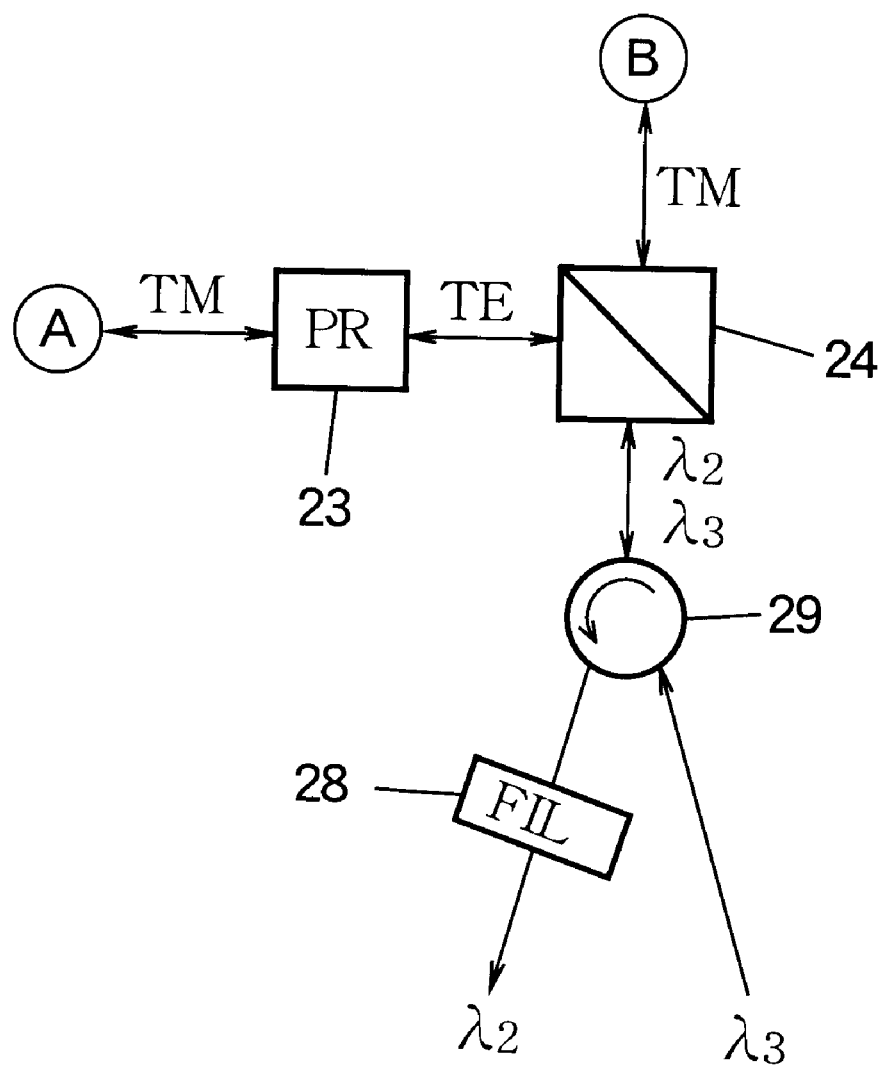
FIG. 9 schematically illustrates a second part of the seventh embodiment.

FIG. 9 shows the rest of the optical input/output coupler, using the same reference numerals as in FIG. 6 to denote the polarization rotator 23, polarization beam splitter 24, filter 28, and optical circulator 29. These components operate in the same way as in the fifth embodiment.

The operation of the seventh embodiment is similar to the operation of the fifth embodiment, except that the optical resonator is not configured as a ring. Instead, light of the wavelength $\lambda_1$ selected by the tunable optical bandpass filter 4 in FIG. 8 travels repeatedly back and forth between the two totally reflecting mirrors 31, while being amplified by the semiconductor optical amplifiers 3. The result is the same as in the preceding embodiments: laser oscillation at the selected wavelength $\lambda_1$.

Signal light of wavelength $\lambda_3$ is provided through the optical circulator 29 in FIG. 9 and split into two orthogonally polarized components, denoted TE and TM in FIG. 29, by the polarization beam splitter 24. The polarization of the TE component is rotated 90° by the polarization rotator 23, resulting in two TM components. These TM components are routed through points A and B to the two dichroic mirrors 32 in FIG. 8 and coupled into the DFG wavelength converter 11 so as to propagate in the TM mode, producing converted light of wavelength $\lambda_2$.

The converted light and returning signal light are coupled out of the optical resonator by the dichroic mirrors 32, follow a path reverse to that described above, passing through points A and B, the polarization rotator 23, and the polarization beam splitter 24 to the optical circulator 29, and are routed by the optical circulator 29 to the filter 28, which blocks the returning signal light and transmits the converted light.

The routing of signal light and converted light through points A and B can be effected through space by optical reflectors such as mirrors and prisms, not explicitly shown in the drawing. The TM polarization can then be maintained naturally, without the need for polarization-maintaining optical fiber.

The components of the optical resonator in FIG. 8 can also be coupled partly or wholly through space, or aligned in direct contact with one another, instead of using optical fiber. Dispensing with optical fiber enables the apparatus to be miniaturized and modularized, and can improve the stability with which pump light is generated, by eliminating the changes that can occur in optical fiber due to environmental factors and aging.

Eighth Embodiment

Figure 10:
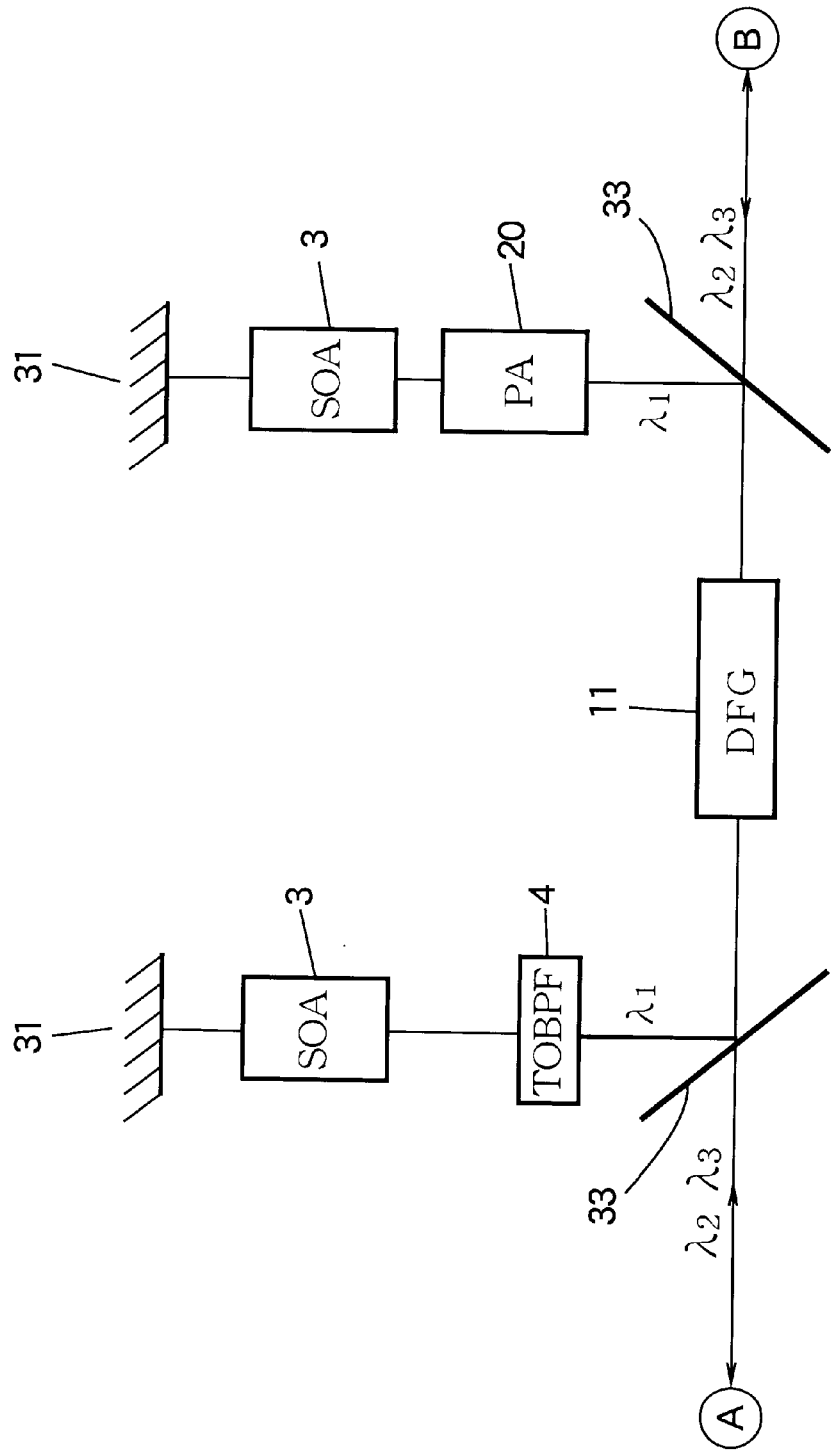
FIG. 10 schematically illustrates a first part of an eighth embodiment.

FIG. 10 shows the optical resonator in an eighth embodiment of the invention, using the same reference numerals as in FIG. 8 for the semiconductor optical amplifiers 3, tunable optical bandpass filter 4, DFG wavelength converter 11, phase adjuster 20, and totally reflecting mirrors 31. These components operate in the same way as in the seventh embodiment.

The eighth embodiment has a pair of dichroic mirrors 33 that reflect light in the 0.8-µm band and transmit light in the 1.55-µm band. These dichroic mirrors 33 accordingly alter the path of pump light ($\lambda_1$) in the optical resonator, while coupling signal light ($\lambda_3$) and converted light ($\lambda_2$) in and out at points A and B.

The eighth embodiment employs the same components as the seventh embodiment, shown in FIG. 9, to route input signal light to points A and B, and to extract converted light.

The operation of the eighth embodiment is similar to the operation of the seventh embodiment, so further description will be omitted. An advantage of the eighth embodiment is that the bending of the optical path in the optical resonator allows the optical resonator to be more compact.

Variations

The embodiments described above can be modified in many ways, some of which are described below.

The wavelength converter is not limited to the structure shown in FIG. 3. Substrate materials other than $LiNbO_3$ can be employed. For example, $LiTaO_3$ or KTP can be employed, or for that matter, a semiconductor substrate can be employed.

The wavelength conversion method is not restricted to second-harmonic generation or difference-frequency generation; sum-frequency generation or four-wave mixing can be employed, for example.

Various types of tunable optical bandpass filters other than dielectric multilayer filters can be employed. For example, tunable optical bandpass filters that operate by acousticoptic effects can be employed. Moreover, wavelength conversion will take place even if the tunable optical bandpass filter is omitted.

Various types of optical couplers not illustrated in the embodiments can be employed for input of signal light and extraction of converted light. For example, prism couplers or grating couplers can be employed.

The optical ring resonators in the first six embodiments were fiber-ring resonators, but some or all of the components of the ring resonator can be coupled through space, as in the seventh and eighth embodiments, instead of through optical fiber. The optical ring resonator can be formed with reflecting mirrors or prisms, for example.

When space coupling is used, the phase adjusters employed in the fourth to eighth embodiments can be eliminated, and the necessary phase adjustment can be performed by moving one or more of the optical components, thereby adjusting the length of the optical path. In the seventh and eighth embodiments, for example, a phase adjustment can be performed by moving one of the totally reflecting mirrors 31.

When the optical ring resonator is configured with optical fiber, polarization-maintaining fiber is preferable, but not strictly necessary. The inventors have obtained efficient wavelength conversion in rings partly configured using ordinary single-mode fiber.

In the seventh and eighth embodiments, it is possible to replace one of the totally reflecting mirrors with a grating mirror. The tunable optical bandpass filter can then be eliminated, because the pump wavelength can be selected by adjusting the angle of the grating mirror.

Alternatively, instead of a grating mirror, a distributed Bragg reflector (DBR) grating can be used. This arrangement has the advantage of producing pump light with a very narrow spectral width, but the DBR grating must be designed to satisfy the QPM condition necessary for wavelength conversion, because the wavelength of the pump light is not adjustable.

The fifth to eighth embodiments can also be modified by placing the wavelength converter outside the optical resonator. For example, a distributed-feedback (DFB) laser, or DBR laser, can be used to supply pump light to the wavelength converter, the optical path being branched so that the pump light enters the wavelength converter at both ends. Polarization insensitivity of the signal light can be attained by any of the methods illustrated in the fifth to eighth embodiments. This arrangement is advantageous when the four-wave mixing method of wavelength conversion is employed. A tunable laser can be used to simplify phase-matching adjustment.

The wavelengths mentioned in the embodiments were given only as examples. The invention is not restricted to any particular wavelengths or wavelength bands.

Those skilled in the art will recognize that further variations are possible within the scope claimed below.

What is claimed is:

1. A wavelength conversion apparatus, comprising:
   an optical resonator in which light circulates repeatedly along an optical path configured as a ring, said optical resonator including
      an optical amplifier disposed on said optical path, for amplifying light of a first wavelength, and
      a wavelength converter disposed on said optical path, for converting part of the light of the first wavelength to light of a second wavelength, different from the first wavelength; and
   an optical coupler coupled to said optical resonator, for extracting the light of said second wavelength from said optical resonator.

2. The wavelength conversion apparatus of claim 1, wherein said optical resonator is configured using optical fiber.

3. The wavelength conversion apparatus of claim 2, wherein said optical fiber comprises polarization-maintaining fiber.

4. The wavelength conversion apparatus of claim 1, wherein said optical resonator also comprises a bandpass filter disposed on said optical path, for defining said first wavelength by transmitting light of said first wavelength and blocking light of wavelengths other than said first wavelength.

5. The wavelength conversion apparatus of claim 4, wherein said bandpass filter is tunable over a range of wavelengths including a wavelength at which said wavelength converter operates with maximum conversion efficiency.

6. The wavelength conversion apparatus of claim 1, wherein said optical amplifier comprises at least one semiconductor optical amplifier.

7. The wavelength conversion apparatus of claim 6, wherein said optical amplifier generates the light of said first wavelength by amplified spontaneous emission.

8. The wavelength conversion apparatus of claim 1, wherein said optical coupler has a pair of waveguides, and extracts the light of said second wavelength by optical tunneling between said waveguides.

9. The wavelength conversion apparatus of claim 1, wherein said optical coupler comprises:
   a first selective reflector disposed on said optical path, for transmitting light of said first wavelength and reflecting light of said second wavelength; and
   a first optical circulator disposed on said optical path between said wavelength converter and said first selective reflector, for transmitting light received from said wavelength converter to said first selective reflector, and extracting light received from said first selective reflector as output light.

10. The wavelength conversion apparatus of claim 9, wherein said first selective reflector comprises a fiber grating.

11. The wavelength conversion apparatus of claim 1, wherein said wavelength converter converts light from said first wavelength to said second wavelength by interaction with signal light having a third wavelength.

12. The wavelength conversion apparatus of claim 11, wherein said wavelength converter performs difference-frequency generation.

13. The wavelength conversion apparatus of claim 11, wherein said optical coupler comprises:
   an input coupler disposed on said optical path, for coupling said signal light into said optical path;
   a first selective reflector disposed on said optical path, for reflecting light of said second wavelength and transmitting light of other wavelengths;
   a first optical circulator disposed on said optical path, for transmitting light to said first selective reflector, and extracting light received from said first selective reflector as output converted light;
   a second selective reflector disposed on said optical path, for reflecting light of said third wavelength and transmitting light of other wavelengths; and
   a second optical circulator disposed on said optical path, for transmitting light to said second selective reflector, and extracting light received from said second selective reflector as output signal light.

14. The wavelength conversion apparatus of claim 13, wherein said first selective reflector and said second selective reflector comprise respective fiber gratings.

15. A wavelength conversion apparatus, comprising:
an optical resonator in which light circulates repeatedly along an optical path configured as a ring, said optical resonator having
an optical amplifier disposed on said optical path, for amplifying light of a first wavelength, and
a wavelength converter disposed on said optical path, for converting part of the light of the first wavelength to light of a second wavelength, different from the first wavelength, wherein said wavelength converter converts light from said first wavelength to said second wavelength by interaction with signal light having a third wavelength; and
an optical coupler coupled to said optical ring resonator, for extracting the light of said second wavelength from said optical ring resonator, wherein the optical coupler comprises:
a polarization beam splitter, for separating said signal light into a first component having a first polarization and a second component having a second polarization;
a first multiplexing coupler disposed on said optical path, for coupling said first component onto said optical path;
a second multiplexing coupler disposed on said optical path, for coupling said second component onto said optical path; and
a first polarization rotator, disposed between said polarization beam splitter and said first multiplexing coupler, for rotating said first polarization to match said second polarization.

16. The wavelength conversion apparatus of claim 15, wherein said first multiplexing coupler and said second multiplexing coupler are disposed adjacent said wavelength converter, on opposite sides of said wavelength converter, and direct said signal light into said wavelength converter from mutually opposite directions.

17. The wavelength conversion apparatus of claim 16, wherein said wavelength converter is disposed at a point on said optical path where light of said first wavelength travels with equal intensity in both directions on said optical path.

18. The wavelength conversion apparatus of claim 16, wherein said first multiplexing coupler and said second multiplexing coupler comprise respective wavelength-division-multiplexing couplers.

19. The wavelength conversion apparatus of claim 16, wherein said first multiplexing coupler and said second multiplexing coupler also couple the light of said second wavelength from said optical path to said polarization beam splitter.

20. The wavelength conversion apparatus of claim 19, wherein said optical resonator also has a phase adjuster, disposed on said optical path, for adjusting a phase of the light of said first wavelength, thereby causing the light of said second wavelength coupled by said first multiplexing coupler and the light of said second wavelength coupled from said second multiplexing coupler to combine constructively in said polarization beam splitter.

21. The wavelength conversion apparatus of claim 19, wherein said optical coupler further comprises an optical isolator for transmitting said signal light into said polarization beam splitter, and blocking return of said signal light from said polarization beam splitter.

22. The wavelength conversion apparatus of claim 19, wherein said optical coupler further comprises an optical circulator, for transmitting said signal light into said polarization beam splitter from a first direction, and transmitting light received from said polarization beam splitter in a second direction different from said first direction.

23. The wavelength conversion apparatus of claim 19, wherein said first polarization rotator rotates said first polarization by forty-five degrees, and said optical coupler further comprises:
a second polarization rotator disposed between said polarization beam splitter and said second multiplexing coupler, for rotating said second polarization by forty-five degrees, thereby causing said first polarization and said second polarization to match.

24. The wavelength conversion apparatus of claim 23, wherein said signal light enters said polarization beam splitter from a first direction, and light of said second wavelength exits said polarization beam splitter in a second direction different from said first direction.

25. A wavelength conversion apparatus, comprising:
a pump light source for generating pump light having a certain polarization;
a polarization beam splitter, for receiving signal light, and splitting said signal light into a first component having a first polarization and a second component having a second polarization;
a pair of multiplexing couplers, coupled to said pump light source and said polarization beam splitter, for combining said first component and said second component with said pump light;
a wavelength converter coupled to said multiplexing couplers, for generating converted light by interaction of said pump light with said first component and said second component, said converted light differing in wavelength from said pump light; and
at least one polarization rotator, coupled to said polarization beam splitter, for rotating at least one polarization among said first polarization and said second polarization, thereby causing said first polarization and said second polarization both to match the polarization of said pump light.

26. The wavelength conversion apparatus of claim 25, comprising just one said polarization rotator, said polarization rotator rotating said first polarization by 90°.

27. The wavelength conversion apparatus of claim 25, comprising a first said polarization rotator rotating said first polarization by 45°, and a second said polarization rotator rotating said second polarization by 45°.

28. The wavelength conversion apparatus of claim 25, wherein said multiplexing couplers are disposed on opposite sides of said wavelength converter.

29. The wavelength conversion apparatus of claim 28, wherein said wavelength converter receives said pump light with equal intensity from each of said multiplexing couplers.

30. The wavelength conversion apparatus of claim 28, wherein said pump light source comprises at least:
an optical amplifier for supplying said pump light to said multiplexing couplers, receiving said pump light from at least one of said multiplexing couplers after said pump light has passed through said wavelength converter, amplifying the pump light thus received, and supplying the amplified pump light again to said multiplexing couplers; and
an optical bandpass filter for limiting said pump light to a certain wavelength.

31. The wavelength conversion apparatus of claim 30, wherein said bandpass filter is tunable over a range of wavelengths including a wavelength at which said wavelength converter operates with maximum conversion efficiency.

32. The wavelength conversion apparatus of claim 30, further comprising optical fiber for coupling said optical amplifier, said bandpass filter, said wavelength converter, and said multiplexing couplers to form an optical ring resonator.

33. The wavelength conversion apparatus of claim 30, further comprising a pair of reflectors, wherein said optical amplifier, said bandpass filter, said wavelength converter, and said multiplexing couplers are disposed on an optical path between said pair of reflectors.

34. The wavelength conversion apparatus of claim 25, wherein said multiplexing couplers supply said converted light to said polarization beam splitter for provision as an output through said polarization beam splitter.

35. The wavelength conversion apparatus of claim 34, wherein said pump light source also comprises a phase adjuster for adjusting said pump light in phase, thereby also adjusting said converted light in phase and causing the converted light supplied from said multiplexing couplers to combine constructively in said polarization beam splitter.

36. The wavelength conversion apparatus of claim 34, further comprising an optical isolator for transmitting said signal light into said polarization beam splitter, and blocking return of said signal light from said polarization beam splitter.

37. The wavelength conversion apparatus of claim 34, further comprising an optical circulator, for transmitting said signal light into said polarization beam splitter from a first direction, and transmitting light received from said polarization beam splitter in a second direction different from said first direction.

38. The wavelength conversion apparatus of claim 34, comprising a first said polarization rotator rotating said first polarization by 45°, and a second said polarization rotator rotating said second polarization by 45°.

39. The wavelength conversion apparatus of claim 38, wherein said signal light enters said polarization beam splitter from a first direction and said converted light leaves said polarization beam splitter in a second direction different from said second direction.

40. The wavelength conversion apparatus of claim 25, wherein said multiplexing couplers are wavelength-division multiplexing couplers.

41. The wavelength conversion apparatus of claim 25, wherein said multiplexing couplers comprise dichroic mirrors that transmit said pump light, reflect said signal light, and reflect said converted light.

42. The wavelength conversion apparatus of claim 25, wherein said multiplexing couplers comprise dichroic mirrors that reflect said pump light, transmit said signal light, and transmit said converted light.

* * * * *